United States Patent
Hirai et al.

(10) Patent No.: US 9,531,332 B2
(45) Date of Patent: Dec. 27, 2016

(54) DISTORTION-COMPENSATION DEVICE AND DISTORTION-COMPENSATION METHOD

(71) Applicant: Panasonic Corporation, Osaka (JP)

(72) Inventors: Yoshito Hirai, Kanagawa (JP); Kouji Okamoto, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/655,217

(22) PCT Filed: Nov. 29, 2013

(86) PCT No.: PCT/JP2013/007043
§ 371 (c)(1),
(2) Date: Jun. 24, 2015

(87) PCT Pub. No.: WO2014/103175
PCT Pub. Date: Jul. 3, 2014

(65) Prior Publication Data
US 2015/0349725 A1    Dec. 3, 2015

(30) Foreign Application Priority Data

Dec. 26, 2012 (JP) ................................ 2012-282752

(51) Int. Cl.
*H03F 1/26* (2006.01)
*H03F 1/32* (2006.01)
(Continued)

(52) U.S. Cl.
CPC ............ *H03F 1/3247* (2013.01); *H03F 3/189* (2013.01); *H03F 3/19* (2013.01); *H03F 3/24* (2013.01);
(Continued)

(58) Field of Classification Search
CPC .............................. H03F 1/3241; H03F 1/3252
(Continued)

(56) References Cited

U.S. PATENT DOCUMENTS

2002/0065048 A1    5/2002 Nagatani et al.
2008/0094139 A1*   4/2008 Takano ................... H03F 1/30
                                                    330/149
(Continued)

FOREIGN PATENT DOCUMENTS

JP    09-069733 A    3/1997
JP    4086133 B2    2/2008
(Continued)

OTHER PUBLICATIONS

International Search Report for Application No. PCT/JP2013/007043 dated Feb. 4, 2014.

*Primary Examiner* — Steven J Mottola
(74) *Attorney, Agent, or Firm* — Pearne & Gordon LLP

(57) ABSTRACT

Disclosed is a distortion-compensation apparatus that can reduce the storage space for storing coefficients required for distortion-compensation calculation, and can accurately execute distortion compensation. Distortion-compensation apparatus (100) compensates for distortion of an output signal from a predetermined circuit by predistortion in which an input signal is preliminarily multiplied by a coefficient. First multiplication section (200c) of distortion-compensation apparatus (100) multiplies an input signal by a first coefficient selected from coefficient candidates in accordance with the input signal; second multiplication section ($201c_1$ to $201c_m$) multiplies a delay signal of an input signal by a tap coefficient; and adding section (202) outputs a signal obtained by adding together an input signal multiplied by the compensation coefficient and the delay signal multiplied by the tap coefficient to the predetermined circuit.

4 Claims, 2 Drawing Sheets

(51) Int. Cl.
  *H03F 3/19* (2006.01)
  *H03F 3/24* (2006.01)
  *H04B 1/04* (2006.01)
  *H03F 3/189* (2006.01)

(52) U.S. Cl.
  CPC ....... *H04B 1/0475* (2013.01); *H03F 2200/451* (2013.01); *H03F 2201/3224* (2013.01); *H04B 2001/0425* (2013.01)

(58) Field of Classification Search
  USPC .................................................. 330/136, 149
  See application file for complete search history.

(56)        References Cited

U.S. PATENT DOCUMENTS

2008/0152037 A1   6/2008  Kim et al.
2010/0277236 A1  11/2010  Horiguchi et al.

FOREIGN PATENT DOCUMENTS

| JP | 2010-518660 A | 5/2010 |
| JP | 2010-183525 A | 8/2010 |
| JP | 2011-135143 A | 7/2011 |
| JP | 2011-176686 A | 9/2011 |
| WO | 01/08320 A1 | 2/2001 |
| WO | 2009/090825 A1 | 7/2009 |

\* cited by examiner

| STEP | COMPENSATION-COEFFICIENT CANDIDATE | | | | TAP COEFFICIENT | |
|---|---|---|---|---|---|---|
| | A1 | A2 | ... | A8 | B1 | B2 |
| 0 | INITIAL VALUE | INITIAL VALUE | ... | INITIAL VALUE | INITIAL VALUE | INITIAL VALUE |
| 1 | UPDATE | UPDATE | ... | UPDATE | ↓ | ↓ |
| 2 | UPDATE | UPDATE | ... | UPDATE | ↓ | ↓ |
| 3 | UPDATE | UPDATE | ... | UPDATE | ↓ | ↓ |
| 4 | UPDATE | UPDATE | ... | UPDATE | ↓ | ↓ |
| 5 | ↓ | ↓ | ... | ↓ | UPDATE | UPDATE |
| 6 | ↓ | ↓ | ... | ↓ | UPDATE | UPDATE |
| 7 | ↓ | ↓ | ... | ↓ | UPDATE | UPDATE |
| 8 | ↓ | ↓ | ... | ↓ | UPDATE | UPDATE |
| 9 | ↓ | ↓ | ... | ↓ | UPDATE | UPDATE |
| 10 | UPDATE | UPDATE | ... | UPDATE | UPDATE | UPDATE |
| 11 | UPDATE | UPDATE | ... | UPDATE | UPDATE | UPDATE |
| 12 | UPDATE | UPDATE | ... | UPDATE | UPDATE | UPDATE |
| 13 | UPDATE | UPDATE | ... | UPDATE | UPDATE | UPDATE |
| 14 | UPDATE | UPDATE | ... | UPDATE | SMALLER THAN THRESHOLD | UPDATE |
| 15 | UPDATE | UPDATE | ... | UPDATE | 0 | UPDATE |
| 16 | UPDATE | UPDATE | ... | UPDATE | ↓ | UPDATE |
| 17 | UPDATE | UPDATE | ... | UPDATE | ↓ | UPDATE |
| 18 | UPDATE | UPDATE | ... | UPDATE | ↓ | UPDATE |

*FIG. 2*

DISTORTION-COMPENSATION DEVICE AND DISTORTION-COMPENSATION METHOD

TECHNICAL FIELD

The present disclosure relates to a distortion-compensation apparatus and a distortion-compensation method that compensate for distortion of a signal output from a predetermined circuit.

BACKGROUND ART

Conventionally, it is known that non-linear signal distortion is generated in an analog circuit, an RF (Radio Frequency) circuit and the like making up a transmitting system such as a radio communication device. To compensate for such signal distortion, a technique called adaptive digital predistortion has been developed.

In this technique, the reverse characteristics of an analog circuit and an RF circuit are stored in a LUT (Look Up Table) in the form of compensation coefficients in accordance with the amplitude and the power of the input signal. With this configuration, distortion compensation is achieved by preliminarily applying to an input signal a compensation coefficient corresponding to the amplitude and the power.

In addition, in this technique, the input signal and the transmission signal to which the compensation coefficients have been applied are compared with each other, and the compensation coefficients are adaptively updated such that the difference between the input signal and the transmission signal is reduced. In this manner, even in the case where the distortion characteristics are changed under the influence of temperature change, voltage change and the like, compensation of signal distortion can be effectively executed.

For example, PTL 1 discloses a technique intended to compensate for signal distortion generated by an amplifier. In this technique, a compensation coefficient of compensation of signal distortion is generated by an adaptive algorithm based on a difference between an input signal and an output signal of the amplifier.

It is known that signal distortion has a memory effect. Memory effect is a phenomenon in which signal distortion is dependent not only on a current input signal, but also on historical input signals. In the technique disclosed in PTL 1, however, memory effect is not taken into consideration, and an effect of limiting signal distortion cannot be sufficiently obtained.

To solve such a problem, PTL 2 discloses a technique in which L×M compensation-coefficient candidates corresponding to possible L states of the power (or amplitude) of a current input signal and possible M states of the power (or amplitude) of historical input signals are preliminarily stored in a memory, and, from the candidates, one compensation coefficient corresponding to the power (or amplitude) of the current and historical input signals is read out, and then, the compensation coefficient is applied to the input signal.

CITATION LIST

Patent Literatures
PTL 1
Japanese Patent Application Laid-Open No. 9-69733
PTL 2
WO01/008320

SUMMARY OF INVENTION

Technical Problem

In the technique disclosed in PTL 2, however, L×M compensation-coefficient candidates are required to be stored in a memory, and therefore a large storage space is required. In a case which historical input signals (number of states N) are taken into consideration to more accurately evaluate the influence of the memory effect, the number of compensation-coefficient candidates is L×M×N, and thus a significantly large storage space is required in order to store the compensation coefficients.

In addition, in the technique disclosed in PTL 2, a current input signal is multiplied by one compensation coefficient to compensate for distortion; however, with such a method, it is difficult to accurately perform distortion compensation.

An object of the present disclosure is to provide a distortion-compensation apparatus and a distortion-compensation method which can reduce the storage space for storing coefficients required for distortion-compensation calculation, and can accurately execute distortion compensation.

Solution to Problem

A distortion-compensation apparatus of an embodiment of the present disclosure compensates for distortion of an output signal from a predetermined circuit by predistortion in which an input signal is preliminarily multiplied by a coefficient, the distortion-compensation apparatus including: a first multiplication section that multiplies the input signal by a first coefficient selected from candidates of the first coefficient in accordance with the input signal; a second multiplication section that multiplies a delay signal of the input signal by a second coefficient; and an adding section that outputs a signal obtained by adding together an input signal multiplied by the first coefficient and a delay signal multiplied by the second coefficient to the predetermined circuit.

A distortion-compensation method of an embodiment of the present disclosure is intended for compensating for distortion of an output signal from a predetermined circuit by predistortion in which an input signal is preliminarily multiplied by a coefficient, the method including: multiplying the input signal by a first coefficient selected from candidates of the first coefficient in accordance with the input signal; multiplying a delay signal of the input signal by a second coefficient; and outputting a signal obtained by adding together an input signal multiplied by the first coefficient and a delay signal multiplied by the second coefficient to the predetermined circuit.

Advantageous Effects of Invention

According to the present disclosure, the storage space for storing coefficients required for distort ion-compensation calculation can be reduced, and distortion compensation can be accurately executed.

BRIEF DESCRIPTION OF DRAWINGS

FIG. 2 is an explanatory table of an updating process for reducing a convergent time.

DESCRIPTION OF EMBODIMENTS

Figure 1:
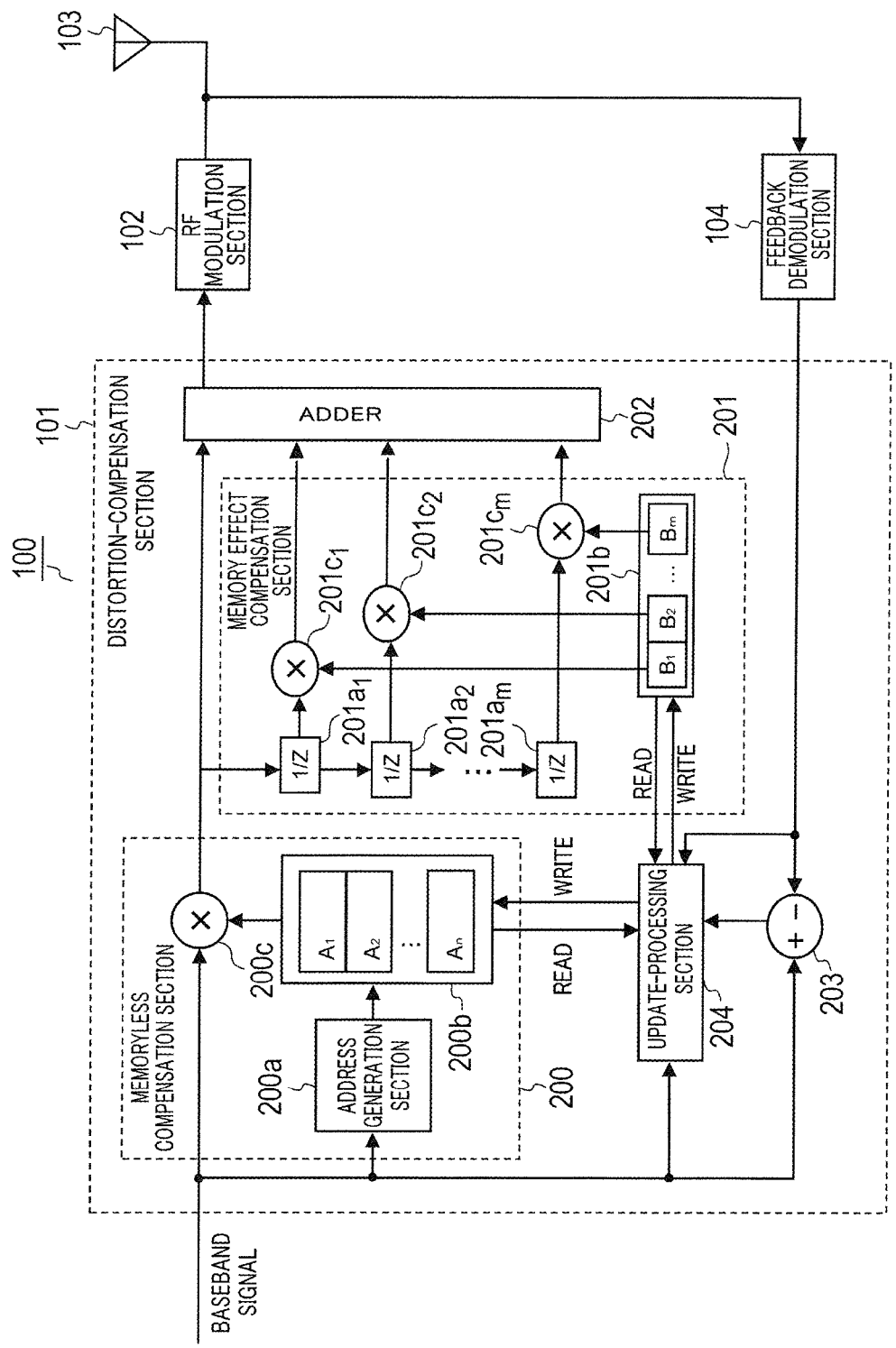
FIG. 1 is a block diagram illustrating a configuration of a transmission apparatus according to an embodiment of the present disclosure.

In the following, an embodiment of the present disclosure will be described in detail with reference to the accompanying drawings.

FIG. 1 is a block diagram illustrating a configuration of transmission apparatus 100 according to an embodiment of the present disclosure. Transmission apparatus 100 includes distortion-compensation section 101, RF (Radio Frequency) modulation section 102, antenna 103, and feedback demodulation section 104.

Distortion-compensation section 101 compensates for signal distortion which is generated in RF modulation section 102. To be more specific, distortion-compensation section 101 compensates for the above-mentioned distortion with use of an adaptive-digital predistortion technique. Distortion-compensation section 101 will be described in detail later.

RF modulation section 102 modulates and amplifies a baseband signal in which distortion is compensated by distortion-compensation section 101, and causes antenna 103 to radiate radio wave. Antenna 103 radiates a signal output from RF modulation section 102 in the form of a radio wave. Feedback demodulation section 104 demodulates a signal output from RF modulation section 102, and outputs the resulting signal to distortion-compensation section 101.

Next, a configuration of distortion-compensation section 101 is described in detail. Distortion-compensation section 101 includes memoryless compensation section 200, memory effect compensation section 201, adder 202, error computing section 203, and update-processing section 204.

Memoryless compensation section 200 performs distortion compensation on a received baseband signal. Memoryless compensation section 200 includes address generation section 200a, first storage section 200b, and multiplier 200c.

Address generation section 200a computes the amplitude of a baseband signal, generates an address corresponding to the computed amplitude, and outputs the generated address to first storage section 200b. It is to be noted that address generation section 200a may generate an address in accordance with the power of a baseband signal, the function of the amplitude, the function of the power and the like, instead of the amplitude of a baseband signal.

First storage section 200b is a storage device such as a memory. First storage section 200b is formed as a LUT (Look Up Table) that stores compensation-coefficient candidate A, (i=1 to n) used for multiplication of a baseband signal.

First storage section 200b outputs a compensation coefficient of the stored compensation-coefficient candidates which corresponds to the address generated by address generation section 200a to multiplier 200c and update-processing section 204.

Multiplier 200c multiplies a baseband signal by a compensation coefficient output by first storage section 200b, and outputs the resulting signal to adder 202.

Memory effect compensation section 201 performs on a delay signal of a baseband signal a signal process for compensation of a memory effect. Memory effect compensation section 201 includes delayers $201a_1$ to $201a_m$, second storage section 201b, and multipliers $201c_1$ to $201c_m$.

Delayers $201a_1$ to $201a_m$ hold historical (primary, secondary, . . . , m delay) baseband signals. While the number of delayers $201a_1$ to $201a_m$ is m in the present embodiment, the number of delayers $201a_1$ to $201a_m$ is not limited as long as at least one delayer is provided.

Second storage section 201b is a storage device such as a memory. Second storage section 201b is formed as an LUT (Look Up Table) that stores tap coefficient $B_j$ (j=1 to m) used for multiplication of a delay signal of a baseband signal. Second storage section 201b outputs the stored tap coefficient to multipliers $201c_1$ to $201c_m$, and update-processing section 204.

Multiplier $201c_1$ to $201c_m$ multiplies a delay signal of a baseband signal by a tap coefficient output by second storage section 201b, and outputs the resulting signal to adder 202.

Adder 202 computes a sum of a signal output by multiplier 200c of memoryless compensation section 200 and signals output by multipliers $201c_1$ to $201c_m$ of memory effect compensation section 201, and outputs the resulting signal to RF modulation section 102.

Error computing section 203 computes difference $e_t$ (=$x_t$−$y_t$) between baseband signal $x_t$ input at time t and signal $y_t$ resulting from demodulation of an output signal in feedback demodulation section 104, and outputs information of the difference to update-processing section 204. The smaller the absolute value of the difference, the greater the effect of the distortion-compensation.

With use of the information of difference $e_t$ output by error computing section 203, update-processing section 204 updates compensation coefficient $A_i$ (i=1 to n) stored in first storage section 200b and tap coefficient $B_j$ (j=1 to m) stored in second storage section 201b.

To be more specific, when baseband signals at times t−j are represented by $x_{t-j}$, signal $y_t$ resulting from demodulation of an output signal in feedback demodulation section 104 is represented as $$y_t = (A_i x_t + \Sigma A_j B_j x_{t-j}) f$$

where $A_i$ represents a compensation coefficient selected from compensation-coefficient candidates stored in first storage section 200b in accordance with the amplitude of baseband signal $x_t$, and f represents an influence of distortion generated in RF modulation section 102.

Update-processing section 204 performs convergence calculation with use of a widely accepted iteration method such as LMS (Least Mean Square) and RLS (Recursive Least Square Algorithm) to determine the values of compensation coefficient A, and each tap coefficient $B_j$ (j=1 to m) such that the absolute value of difference $e_t$ between input baseband signal $x_t$ and signal $y_t$ resulting from demodulation of feedback demodulation section 104, that is, $$e_t = x_t - y_t = x_t - (A_i x_t + \Sigma A_j B_j x_{t-j}) f$$

is a small value.

Then, with use of the determined values, update-processing section 204 updates the value of compensation coefficient $A_i$ stored in first storage section 200b and the value of each tap coefficient $B_j$ (j=1 to m) stored in second storage section 201b.

As described, in the present embodiment, it suffices to store one tap coefficient for each historical baseband signal, and thus the storage space required for distortion compensation can be reduced. In addition, the signal distortion correction is performed not only by multiplying a current baseband signal by a compensation coefficient to generate a signal, but also by multiplying a historical baseband signal by a tap coefficient to generate a signal and by synthesizing the signals, and thus, highly accurate distortion compensation is achieved.

Further, by performing the following updating process, the time required for convergence of compensation coefficient $A_i$ and each tap coefficient $B_j$ (j=1 to m) can be reduced.

FIG. 2 is an explanatory table of an updating process for reducing a convergence time. It is to be noted that FIG. 2 shows the case where the number of compensation-coefficient candidates is 8 (n=8), and the number of tap coefficients is 2 (m=2).

In this updating process, first, update-processing section 204 executes convergence calculation on compensation coefficient $A_i$ (compensation coefficient selected from $A_1$ to $A_8$ in accordance with the amplitude of baseband signal $x_t$) by an iteration method for a predetermined time, and sequentially updates compensation coefficient A, (steps 0 to 4 of FIG. 2). Meanwhile, the value of tap coefficients $B_1$ and $B_2$ is set to a constant value (initial value).

Subsequently, update-processing section 204 executes convergence calculation on tap coefficients $B_1$ and $B_2$ by an iteration method for a predetermined time, and sequentially updates tap coefficients $B_1$ and $B_2$ (steps 5 to 9 of FIG. 2). Meanwhile, the value of compensation coefficient $A_i$ is set to a constant value (the value set at the last update at step 4 of FIG. 2).

Thereafter, update-processing section 204 applies an iteration method on compensation coefficient $A_i$ and tap coefficients $B_1$ and $B_2$, and sequentially updates compensation coefficient $A_i$ and tap coefficients $B_1$ and $B_2$ (steps 10 to 18 of FIG. 2).

Through the above-mentioned processes, in comparison with the case where compensation coefficient $A_i$ and tap coefficients $B_1$ and $B_2$ are simultaneously converged from the start, compensation coefficient $A_i$ and tap coefficients $B_1$ and $B_2$ can be converged in a short time.

In addition, when the absolute value of the convergence value of the tap coefficient becomes smaller than a predetermined threshold, update-processing section 204 determines that coefficient is 0, and excludes a compensation coefficient or a tap coefficient in which the absolute value of the convergence value is smaller than a predetermined threshold from the subjects for convergence calculation.

In addition, when the absolute value of the convergence value of tap coefficient $B_k$ becomes smaller than a predetermined threshold, the values of compensation coefficient $A_i$ and tap coefficient $B_j$ (j=1 to m, j≠k) are determined such that, with $B_k=0$, the absolute value of $$e_t = x_t - y_t = x_t - (A_i x_t + \Sigma_{j \neq k} A_i B_j x_{t-j}) f$$

is a small value.

FIG. 2 shows an exemplary case where the absolute value of the convergence value of tap coefficient $B_1$ becomes smaller than a predetermined threshold at step 14. Through the above-mentioned processes, each coefficient can be converged more quickly, and in this case, the circuit for the updating process of $B_1$ can be stopped, thus making it possible to achieve power saving.

While update-processing section 204 updates compensation coefficient $A_i$ and tap coefficient $B_j$ (j=1 to m) with use of information of difference $e_t$ output by error computing section 203 in the above-mentioned embodiment, it is also possible to set a part of the coefficients (for example, a compensation-coefficient candidate or a tap coefficient) or all of the coefficients to a value preliminarily obtained by an experiment and the like so as not to perform the update by update-processing section 204.

This application is entitled to and claims the benefit of Japanese Patent Application No. 2012-282752 dated Dec. 26, 2012, the disclosure of which including the specification, drawings and abstract is incorporated herein by reference in its entirety.

INDUSTRIAL APPLICABILITY

The distortion-compensation apparatus and the distortion-compensation method according to the present disclosure are suitable for a distortion-compensation apparatus and a distortion-compensation method that compensate for distortion of a signal output from a predetermined circuit.

REFERENCE SIGNS LIST

100 Transmission apparatus
101 Distortion-compensation section
102 RF modulation section
103 Antenna
104 Feedback demodulation section
200 Memoryless compensation section
200a Address generation section
200b First storage section
200c Multiplier
201 Memory effect compensation section
$201a_1$ to $201a_m$ Delayer
201b Second storage section
$201c_1$ to $201c_m$ Multiplier
202 Adder
203 Error computing section
204 Update-processing section

The invention claimed is:

1. A distortion-compensation apparatus comprising:
    a first multiplication section that obtains a first multiplication signal by multiplying an input signal by a first pre-distortion coefficient selected from a plurality of first coefficient candidates in accordance with the input signal;
    a second multiplication section that obtains a second multiplication signal by multiplying a delay signal of the input signal by a second pre-distortion coefficient;
    an adding section that obtains an addition signal by adding the first multiplication signal and the second multiplication signal and outputs the addition signal to a predetermined circuit; and
    an update-processing section that updates the first pre-distortion coefficient and the second pre-distortion coefficient by convergence calculation using an iteration scheme based on the input signal and the output signal outputted from the predetermined circuit, wherein,
    the update-processing section updates the first pre-distortion coefficient, then updates the second pre-distortion coefficient, and after then updates both of the first updated pre-distortion coefficient and the second updated pre-distortion coefficient.

2. The distortion-compensation apparatus according to claim 1, wherein when an absolute value of the second updated pre-distortion coefficient is smaller than a predetermined threshold, the update-processing section excludes the second updated pre-distortion coefficient from the convergence calculation.

3. The distortion-compensation apparatus according to claim 1, wherein the iteration scheme is a Least Mean Square scheme.

4. A distortion-compensation method comprising:
    obtaining a first multiplication signal by multiplying an input signal by a first pre-distortion coefficient selected from a plurality of first coefficient candidates in accordance with the input signal;

obtaining a second multiplication signal by multiplying a delay signal of the input signal by a second pre-distortion coefficient;

obtaining an addition signal by adding the first multiplication signal and the second multiplication signal;

outputting the addition signal to a predetermined circuit; and updating the first pre-distortion coefficient, then updating the second pre-distortion coefficient, and after then updating both of the first updated pre-distortion coefficient and the second updated pre-distortion coefficient by convergence calculation using an iteration scheme based on the input signal and the output signal outputted from the predetermined circuit.

* * * * *